(12) United States Patent
Yoneyama et al.

(10) Patent No.: US 6,263,137 B1
(45) Date of Patent: Jul. 17, 2001

(54) OPTICAL MODULE SUBSTRATE, OPTICAL MODULE, AND METHOD OF MANUFACTURING OPTICAL MODULE

(75) Inventors: Shunichi Yoneyama, Kanagawa; Hiromi Nakanishi, Osaka, both of (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/267,684

(22) Filed: Mar. 15, 1999

(30) Foreign Application Priority Data

Mar. 16, 1998 (JP) .................................. 10-065616
Mar. 17, 1998 (JP) .................................. 10-066829
Feb. 18, 1999 (JP) .................................. 11-040252

(51) Int. Cl.[7] ........................................... G02B 6/30
(52) U.S. Cl. ............................ 385/49; 385/88; 385/90
(58) Field of Search ............................. 385/49, 88–94, 385/14, 79

(56) References Cited

U.S. PATENT DOCUMENTS 5,611,008  3/1997  Yap ........................................ 385/14
5,617,495  4/1997  Funabashi et al. ..................... 385/92
5,647,042  7/1997  Ochiai et al. .......................... 385/56
5,680,493  10/1997 Naitoh .................................... 385/51
5,748,822  5/1998  Miura et al. ........................... 385/90
5,960,141  * 9/1999 Sasaki et al. .......................... 385/88

FOREIGN PATENT DOCUMENTS 57-76509   5/1982  (JP) .
2-7010     1/1990  (JP) .
9-61674    3/1997  (JP) .
9-152527   6/1997  (JP) .

* cited by examiner

*Primary Examiner*—Phan T. H. Palmer
(74) *Attorney, Agent, or Firm*—McDermott, Will & Emery

(57) ABSTRACT

The optical module comprises a substrate consisting of single member. This substrate can mount an optical fiber, a ferrule, and a semiconductor optical device. The substrate has first, second, and third regions successively arranged along a predetermined axis. The substrate also has a ferrule support groove, an optical fiber support groove, and a device mount portion. The ferrule support groove is formed in the first region and extends along the predetermined axis. The optical fiber support groove is formed in the second region and extends along the predetermined axis. The device mount portion is formed in the third region. The semiconductor optical device is provide to be optically coupled to the optical fiber.

22 Claims, 18 Drawing Sheets

OPTICAL MODULE SUBSTRATE, OPTICAL MODULE, AND METHOD OF MANUFACTURING OPTICAL MODULE

BACKGROUND OF THE INVENTION

1. Field of the Invention

The present invention relates to an optical module substrate, an optical module and a method of manufacturing the optical module; and, in particular, to an optical module substrate, an optical module having a single substrate provided with a fiber support groove and a ferrule support groove, and a method of making the same.

2. Related Background Art

In conventional optical modules, a support member for mounting a ferrule, an optical fiber, and a laser diode or the like is constituted by a platform made of silicon and a metal base on which the platform is mounted. A groove for guiding an optical fiber is provided on the platform, while a groove for supporting a ferrule is on the metal base. A laser diode, the optical fiber, and the ferrule are whole mounted on the support member.

A method of manufacturing the optical module comprises the steps of: forming the silicon platform with the groove for the optical fiber; forming the metal base with the groove for the ferrule; mounting the platform to the base; mounting the laser diode of the platform; and disposing the ferrule and the optical fiber in their corresponding grooves.

In a conventional manufacturing method of an optical module, the base and the platform are bonded together after separately forming each member. Since the base and the platform is made of different members, it is necessary to precisely shape both grooves and align the groove for the optical fiber and the groove for the ferrule with high accuracy.

Japanese Patent Application Laid-Open No. 57-76509 discloses a device for coupling an optical fiber to a lens. The device comprises a groove for holding the optical fiber and a groove for arranging a rod lens. Both grooves are formed on a single substrate. The application also discloses a method of manufacturing the device. This coupling device, however, does not relate to optical modules and is different from the present invention.

Japanese Patent Application Laid-Open No. 2-7010 discloses a method of manufacturing a device having a tandem groove. The method comprises a step of forming a groove for holding an optical fiber coat stripped and a groove for holding a coated optical fiber. Since this disclosure relates to the forming grooves with different widths, it lacks to disclose any problem to be overcome by the present invention.

SUMMARY OF THE INVENTION

It is an object of the present invention to provide an optical module substrate, an optical module, and a method of manufacturing the optical module, which reduce stress caused to the optical fiber and the ferrule from the substrate with temperature change.

The optical module in accordance with the present invention comprises an optical fiber, a ferrule, a semiconductor optical device, and a substrate on which the optical fiber, the ferrule and the semiconductor optical device are mounted. The substrate has first, second, and third regions successively arranged along a predetermined axial direction. The substrate also has a ferrule support groove, an optical fiber support groove, and a device mount portion. The ferrule support groove formed in the first region has two side faces for supporting ferrule and extends in the predetermined axial direction. The optical fiber support groove formed in the second region has two side faces for supporting the optical fiber and extends in the predetermined axial direction. The device mount portion is formed in the third region and the semiconductor optical device is provided to be optically coupled to the optical fiber. Since the optical fiber support groove and the ferrule support groove are formed on the same substrate, the stress applied to the ferrule and optical fiber from these support grooves can be reduced even when the grooves are deformed due to thermal expansion.

The substrate for the optical module in accordance with the present invention can comprise a connection groove formed to separate the first region from the second region. The connection groove has a portion deeper than the ferrule support groove. The connection groove can extend from one side to the other side of the substrate and extend in a direction intersecting the predetermined axis. The distal end of the ferrule is projected to the connection groove and the optical fiber extending from the ferrule immediately reach to the optical fiber support groove.

The substrate for the optical module in accordance with the present invention can include a positioning groove. The positioning groove is provided between the device mount portion and the optical fiber support groove. The positioning groove can extend from one side to the other side of the substrate and can extend in a direction intersecting the predetermined axis to separate the second region and the third region. The relative position between the optical fiber and the semiconductor optical device can be determined by abutting the end of the fiber to a side surface of the positioning groove. Therefore appropriate optical coupling between the optical fiber and the semiconductor device can be achieved.

In the substrate for the optical module in accordance with the present invention, the device mount portion can provide a positioning mark for determining a position at which the semiconductor optical device is mounted. The positioning mark can be simultaneously formed with the ferrule support groove and the optical fiber support groove.

In the substrate for the optical module in accordance with the present invention, an intermediate groove can be formed between the optical fiber support groove and the ferrule support groove in the second region. This intermediate groove extends in the predetermined axial direction. The intermediate groove has a width greater than that of the optical fiber support groove. This groove can include at least one surface making an obtuse angle with each of the two side faces of the optical fiber support groove. Therefore, the groove can reduce the stress caused to the optical fiber.

A method of manufacturing an optical module in accordance with the present invention comprises the steps of: forming a ferrule support groove and an optical fiber support groove in the first and the second regions on the substrate; mounting a semiconductor optical device in the third region; and providing the optical fiber in the optical fiber support groove to be optically coupled to the semiconductor optical device and providing the ferrule in the ferrule support groove.

When the optical fiber support groove and the ferrule support groove are thus formed at the same time, their relative positions can be improved. The optical fiber and the ferrule are disposed in the optical fiber support groove and the ferrule support groove, respectively. The optical module can be manufactured without any excess force to the optical fiber.

A method of manufacturing an optical module in accordance with the present invention can further comprise the step of forming a connection groove to separate the first region and the second region. An arrangement between the optical fiber support groove and the ferrule support groove can be adjusted by the shape of the connection groove. The optical fiber extending from the ferrule immediately reaches to the optical fiber support groove.

The method of manufacturing an optical module in accordance with the present invention can include the step of; forming a positioning mark for determining a position at which the semiconductor optical device is mounted; and the step of aligning the semiconductor optical device by the positioning mark. Since the optical fiber support groove and the positioning mark can be accurately formed for their relative position, the semiconductor optical device can be aligned with respect to the optical fiber support groove.

The method of manufacturing an optical module in accordance with the present invention can include the step of forming an intermediate groove simultaneously with the optical fiber support groove and the ferrule support groove. The intermediate groove is formed between the optical fiber support groove and the ferrule support groove in the second region and extends in the predetermined axial direction. The intermediate groove has a width greater than that of the optical fiber support groove and has at least one surface making an obtuse angle with each of two side faces of the optical fiber support groove. When the intermediate groove is formed at the same manufacturing step as the optical fiber support groove and the ferrule support groove, the angle between a side face of the optical fiber support groove and a surface of the intermediate groove can be reproduced with high accuracy.

The present invention will become more fully understood from the detailed description given hereinbelow and the accompanying drawings which are given by way of illustration only, and thus are not to be considered as limiting the present invention.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the are from this detailed description.

DETAILED DESCRIPTION OF THE PREFERRED EMBODIMENTS

Figure 1A:
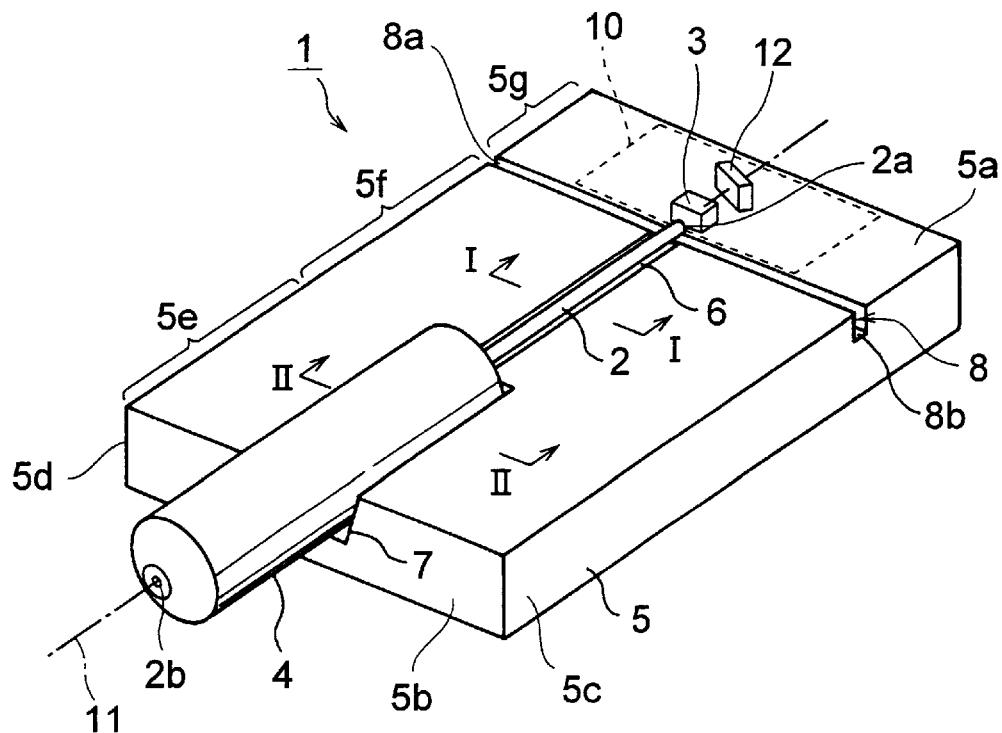
FIG. 1A is a perspective view showing a principal portion of an optical module in accordance with the present invention.

In the following detailed description and in several figures of the drawings, like elements are identified with like reference numerals.

FIG. 1A is a perspective view showing the principal portion of the optical module in accordance with the present invention. According to FIG. 1A, the principal portion 1 of the optical module comprises an optical fiber 2, a semiconductor optical device 3, a ferrule 4, and a substrate 5. The substrate 5 consists of an integral member. The substrate 5 is made of silicon. The substrate 5 comprises an optical fiber support groove 6, a ferrule support groove 7, a positioning groove 8, and a device mount portion 10. The semiconductor optical device 3 is mounted at the device mount portion 10.

Referring to FIG. 1A, the substrate 5 comprises a first region 5e, a second region 5f, and a third region 5g. All regions can be provided on the same surface 5a of the substrate.

The optical fiber support groove 6 is formed in the second region 5f. The optical fiber support groove 6 centered at the axis 11 extending in a predetermined direction (hereinafter referred to as center axis) can support the optical fiber 2 by two side faces. The ferrule support groove 7 centered at the center axis extends from one side face 5b of the substrate toward the optical fiber support groove 6 and can support the ferrule 4 by two side faces. The positioning groove 8 making right angle with center axis is formed between the device mount portion and the optical fiber support groove 6. The positioning groove 8 has a flat side surface 8a in contact with a tip 2a of the optical fiber 2 and is deeper than the optical fiber support groove 6. The positioning groove 8 extends from one face 5c of the substrate 5 to the other face 5d thereof.

The device mount portion 10 is formed in the third region 5g. This configuration can realize optical coupling between the optical fiber 2 supported in the optical fiber support groove 6 and the semiconductor optical device 3 mounted in the device mount portion 10.

The substrate 5 may comprise a first surface and a second surface in parallel with each other. The first surface has the optical fiber support groove 6 and the device mount portion 10 thereon. The second surface is formed to reduce the difference in depth between the optical fiber support groove 6 and the ferrule support groove 7. The ferrule support groove 7 is formed on the second surface such that the center axis of the ferrule support groove 7 coincides with that of the optical fiber support groove 6.

The semiconductor optical device 3 can includes a semiconductor light-emitting element (hereinafter referred to as light-emitting element) for converting electrical signals to optical signals, and a semiconductor light-receiving elements (hereinafter referred to as light-receiving element) for converting optical signals to electrical signals. For examples, a semiconductor laser diode and a semiconductor photodiode can be used as the light-emitting element and light-receiving element, respectively. In the case where the light-emitting device 3 is a laser diode (LD), the LD 3 is mounted such that its light emitting face faces a tip of the optical fiber 2. Since the optical axis of the light emitted from the light emitting element coincides with the axis of the optical fiber 3, the optical coupling between the optical fiber 2 and the light emitting element is achieved. A monitor photodiode 12 is also mounted on the substrate.

The ferrule 4 has a cylindrical shape. The optical fiber 2 is inserted such that the tip 2b of the optical fiber 2 appears at one end face of the ferrule 4. The ferrule 4 has an outside diameter on the order from 1.25 mm to 2.5 mm. The optical fiber 2 having a coat stripped diameter of 125 um is inserted into the ferrule.

The optical fiber support groove 6 has two side faces for supporting the optical fiber 2 and exhibits a depressed cross-sectional form with respect to the surface 5a. The ferrule support groove 7 has two side faces for supporting the ferrule 4 and exhibits a depressed cross-sectional form with respect to the surface 5a.

Figure 1B:
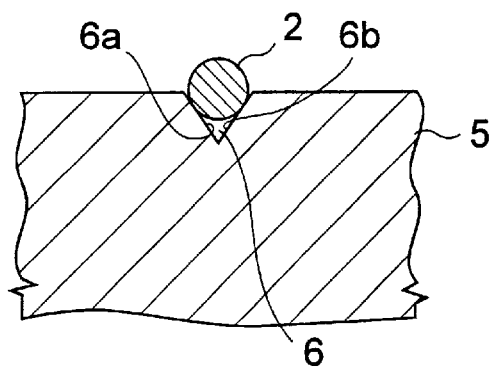
FIG. 1B is a sectional view taken along the I—I section in FIG. 1A.
Figure 1C:
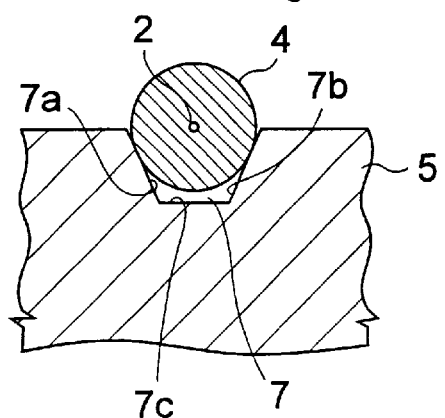
FIG. 1C is a sectional view taken along the II—II section in FIG. 1A.

FIG. 1B shows the cross sectional form of the optical fiber support groove 6 taken along I—I section in FIG. 1A. FIG. 1C shows the cross sectional form of the ferrule support groove 7 taken along the II—II section in FIG. 1A. Since the diameters of the optical fiber 2 and ferrule 4 have such values mentioned above, the optical fiber support groove 6 is shaped like V character. The ferrule support groove 7 is shaped like a trapezoid with side faces opening toward the surface.

Employing silicon with (100) surface as a substrate and forming the grooves by chemical etching, (111) surface are involved in the grooves as side faces. The etching time and the width of grooves influence the grooves 6, 7 to be formed into a V-shaped groove or a trapezoid groove as shown in FIGS. 1B and 1C because the etching rate of silicon by using the KOH solution as an etchant depends on the surface orientation and (111) surface shows the slowest etching rate. The angle formed between the surface of the substrate and each of the two side faces of the grooves becomes an obtuse angle.

Since the optical fiber support groove 6 and the ferrule support groove 7 are formed on the same substrate 5, the shapes of the grooves 6, 7 would be influenced under the same thermal expansion coefficient. Even when the optical fiber support groove 6 and the ferrule support groove 7 are deformed due to thermal expansion, the reduced stress as compared to the conventional ones are caused to the optical fiber 2 and the ferrule 4 from the substrate.

The optical fiber support groove 6 and the ferrule support groove 7 are preferably formed in the same manufacturing step. In the case where these grooves 6, 7 are formed simultaneously, the accuracy of their relative positions would be improved. The positions of the respective center axes of the optical fiber support groove 6 and the ferrule support groove 7 are formed with desirably relative accuracy.

Figure 2:
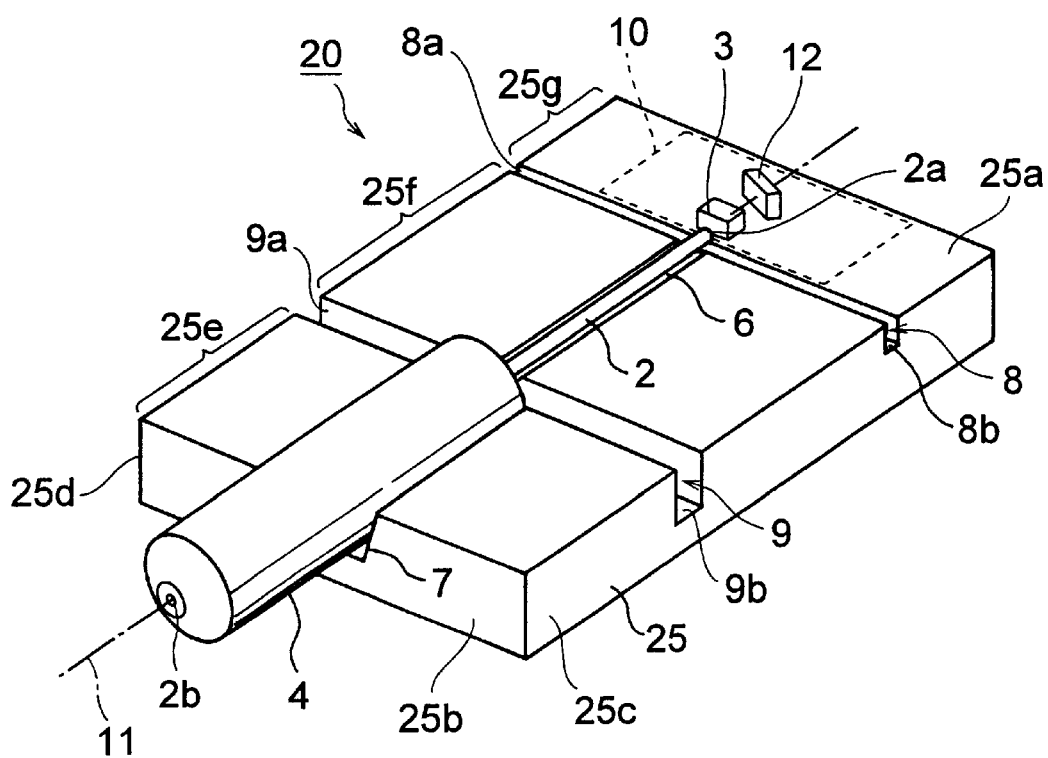
FIG. 2 is a perspective view showing a principal portion of an optical module with a connection groove.

FIG. 2 is a perspective view showing a principal portion 20 of an optical module in accordance with another embodiment of the present invention. The principal portion 20 of the optical module has the same configuration as the substrate 5 except that the substrate 25 includes an additional connection groove 9. The connection groove 9 extends in a direction orthogonal to the center axis 11 and is formed between the optical fiber support groove 6 and the ferrule support groove 7 to separate the first region 25e and the second region 25f. The connection groove 9 comprises a flat surface 9a and a bottom surface 9b. The surface 9a faces one end face of the ferrule 4. The bottom surface 9b is deeper than that of the ferrule support groove 7.

A method of manufacturing an optical module in accordance with the present invention will now be described with reference to FIGS. 3A to 7B. The respective steps shown in FIGS. 3A to 7B except the connection groove formation step are applicable to the manufacturing of the principal portion of optical modules shown in FIG. 1A and FIG. 2. In the following, the method of manufacturing an optical module including the connection groove 9 will be described.

Figure 3A:
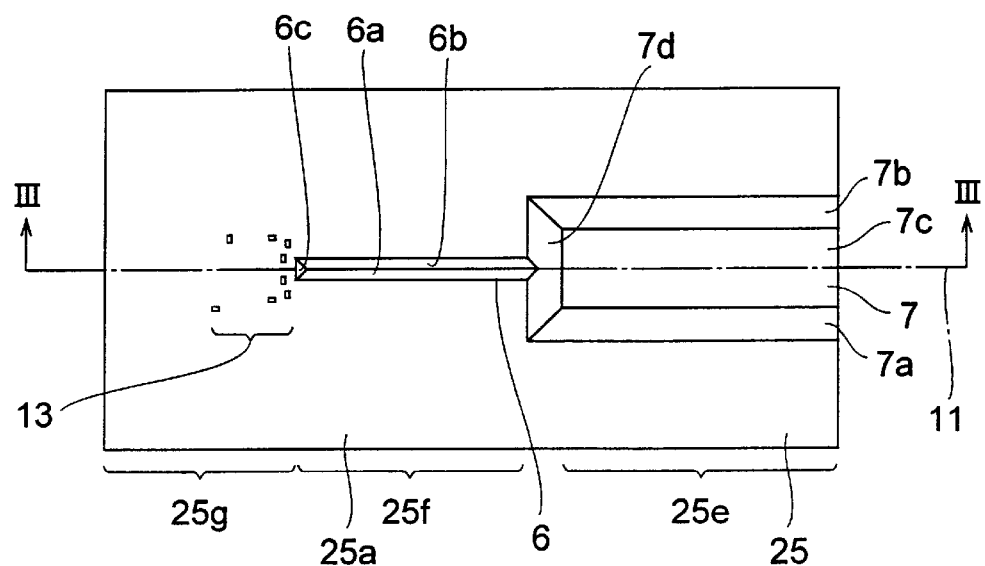
FIG. 3A is a plan view showing a manufacturing step of an optical module after a groove formation step.
Figure 3B:
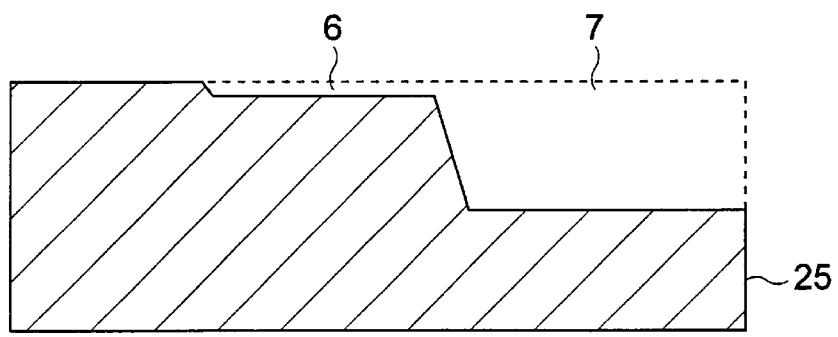
FIG. 3B is a sectional view taken along the III—III section in FIG. 3A.

FIG. 3A is a plan view of the substrate 25 at the groove formation step, FIG. 3B is a sectional view taken along the III—III section in FIG. 3A. In the groove formation step, an optical fiber support groove 6 is formed on the second region 25f and a ferrule support groove 7 is formed on the first region 25e. These grooves 6, 7 are formed to be centered at the axis 11 extending in one direction. The ferrule support groove 7 is connected to the optical fiber support groove 6. When these grooves 6, 7 are formed by chemical etching, the following procedures are used. A pattern having predetermined openings for defining each groove is formed on a silicon (100) surface with a photosensitive material such as photo-resist. The silicon substrate is chemically etched with a KOH solution to form the grooves 6, 7. The widths of the openings are determined by taking the side etch amount into account. The cross-sectional forms of the grooves 6, 7 depend on the width of the openings and the etching time.

In the groove formation step, a positioning mark 13 for determining positions at which the light-emitting element 3 and the light-receiving element 12 are placed can be simultaneously formed on the surface 25a of the substrate. By using the positioning mark 13, the light-emitting element is provided with desirably relative accuracy to the optical fiber and the light-receiving element 12 is provided with desirably relative accuracy to the light-emitting element 3.

Figure 9:
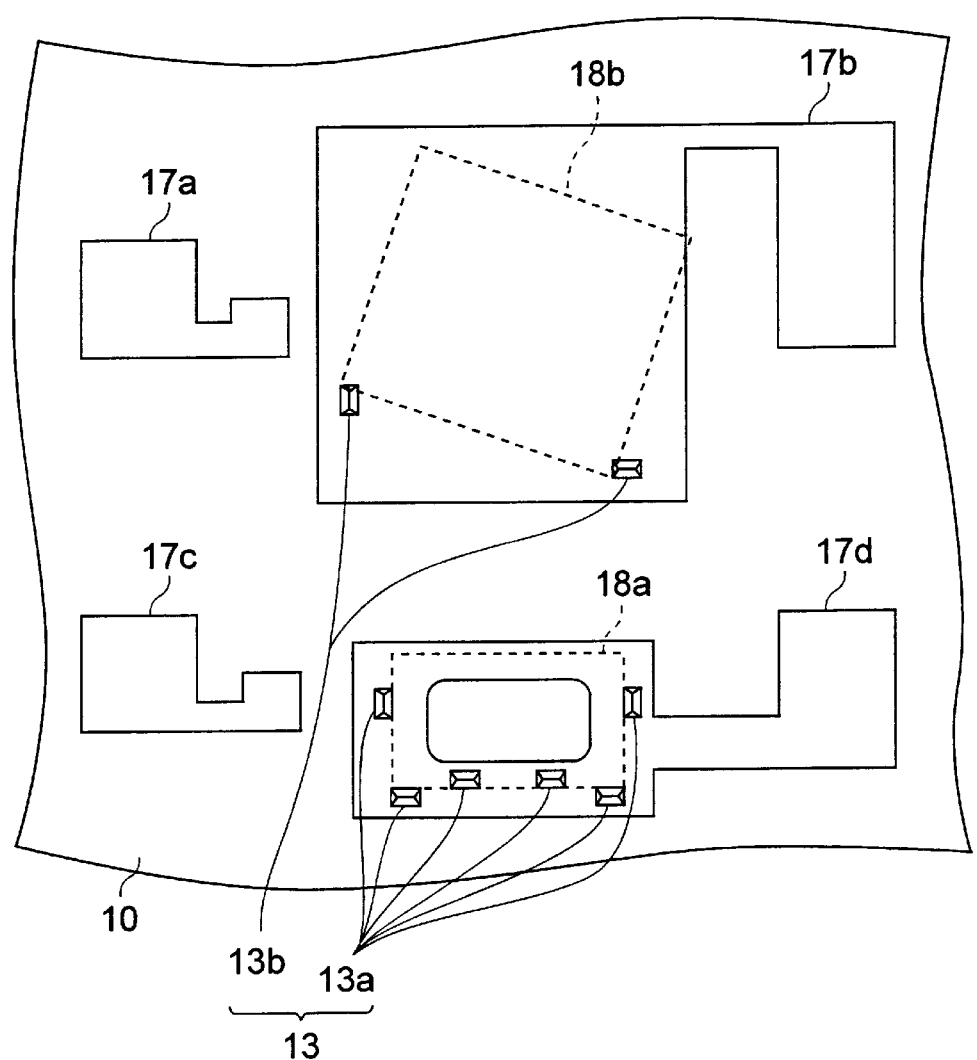
FIG. 9 is a plan view of the device mount portion on the substrate.

After the groove formation step, electrodes (not illustrated) for connecting the light-emitting element 3 and the light-receiving element 12 are formed on the surface 25a of the substrate 25. FIG. 9 is a plan view showing the device mount portion 10 of the substrate 25. FIG. 9 shows a positioning mark 13a, 13b and electrodes 17a, 17b, 17c, 17d. The positioning mark 13a is provided for mounting the light-emitting element 3 and the positioning mark 13b is provided for mounting light-receiving element 12. The electrodes 17a to 17d are used for the wire-bonding. A broken line 18a indicates a position at which the light-emitting element 3 is mounted and broken line 18b corresponds to the mounting position of the light-receiving element 12.

In FIGS. 3A and 3B, the optical fiber support groove 6 has a V-shaped cross-sectional form with two side faces 6a, 6b for supporting the optical fiber 2. The ferrule support groove 7 has a trapezoid cross-sectional form with two side faces 7a, 7b for supporting the ferrule 4 and one bottom face 7c. The respective depths of the grooves 6, 7 are provided such that the predetermined axis 11 coincides with the optical axis of the light-emitting element 3.

Figure 4A:
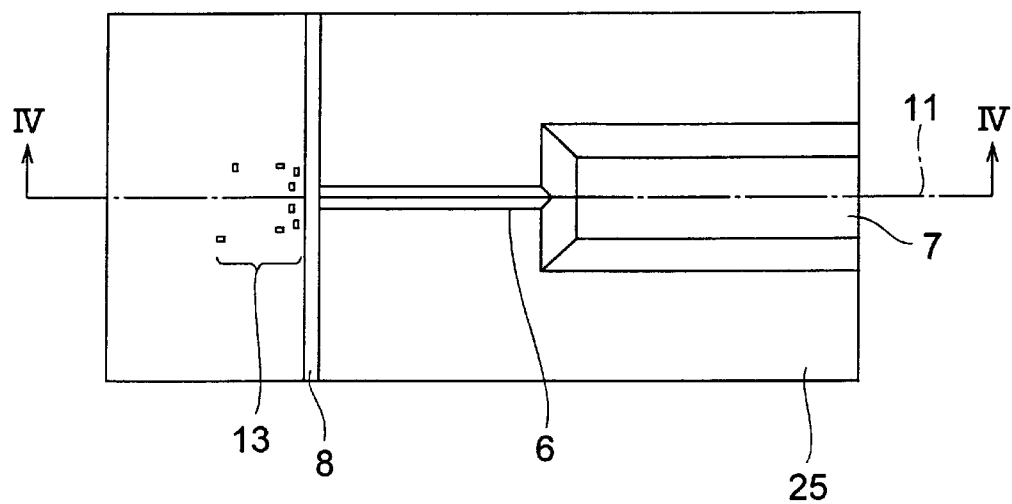
FIG. 4A is a plan view showing a manufacturing step of an optical module after a positioning groove formation step.
Figure 4B:
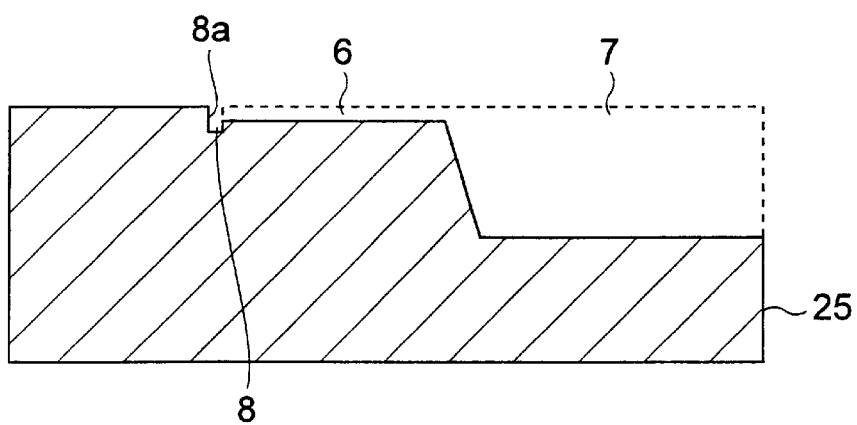
FIG. 4B is a sectional view taken along the IV—IV section in FIG. 4A.

FIG. 4A is a plan view of the substrate 25 after the positioning groove 8 is formed and FIG. 4B is a sectional view taken along the IV—IV section in FIG. 4A. In FIGS. 4A and 4B, the positioning groove 8 is formed in the end of the optical fiber support groove 6 and extends in a direction orthogonal to the axis 11. The positioning groove 8 has a side surface 8a to be abutted by the tip 2a of the optical fiber 2 and has a deeper portion than the optical fiber support groove 6. The groove 8 has a width to eliminate the tapered surface (6c in FIG. 3A) formed at the end of the optical fiber support groove 6. The positioning groove 8 is formed, for example, by dicing. Forming the length of the optical fiber extending from the ferrule 4 slightly longer than that of the optical fiber support groove 6, the tip 2a of the optical fiber 2 is provided to abut to the side face 8a of the positioning groove 8 before the end face of the ferrule 4 comes into contact with the end portion of the ferrule support groove 7. The position of the optical fiber can be determined by this abutting. This provides the easier positioning of the tip 2a of the optical fiber 2.

Figure 5A:
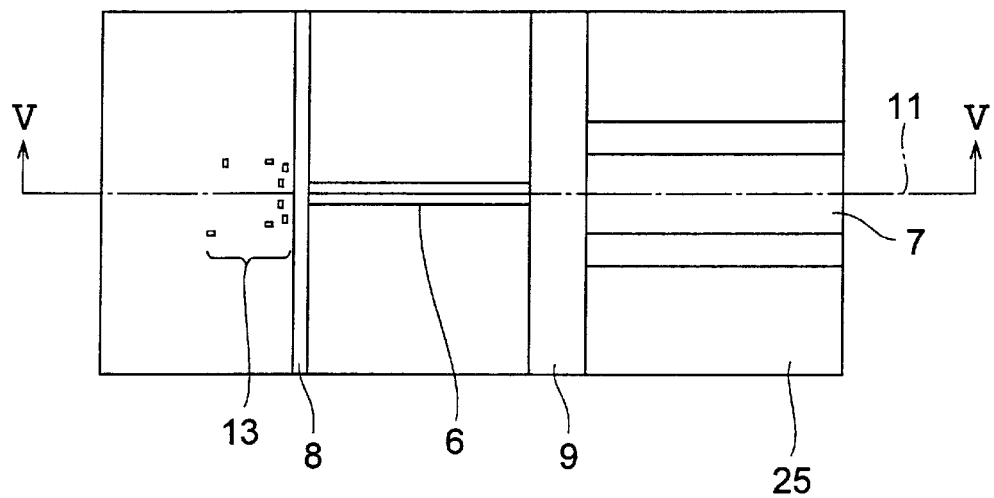
FIG. 5A is a plan view showing a manufacturing step of an optical module after a connection groove formation step.
Figure 5B:
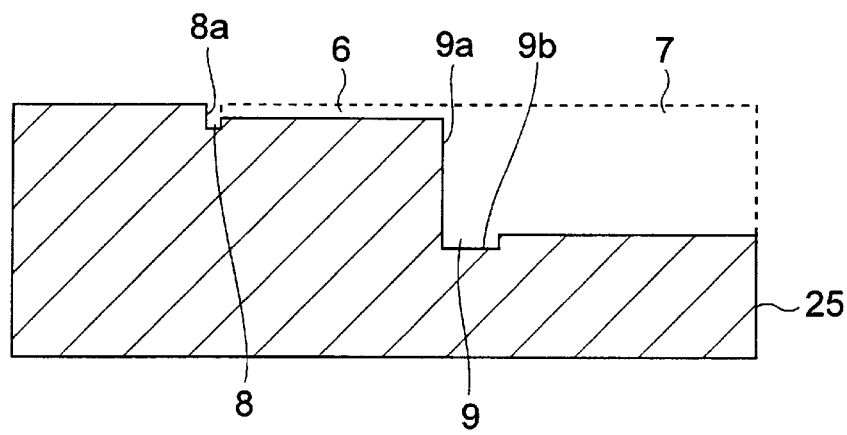
FIG. 5B is a sectional view taken along the V—V section in FIG. 5A.

It is preferred to provide the connection groove 9 as shown in FIGS. 5A and 5B. FIG. 5A is a plan view of the substrate 25 after the connection groove 9 is formed and FIG. 5B is a sectional view taken along the V—V section in FIG. 5A. In FIGS. 5A and 5B, a connection groove 9 is formed between the optical fiber support groove 6 and the ferrule support groove 7. The groove 9 extends in a direction orthogonal to the axis 11 from the side face of the substrate 25 to the other. The groove 9 has a rectangular or square cross-section and has a bottom face 9b deeper than the ferrule support groove 7. The groove 9 has a side surface 9a facing to the end face of the ferrule 4 (4a in FIG. 7B). The side surface 9a is provided substantially in parallel with the end face of the ferrule 4. In the case where the groove 9 provides the bottom surface 9b, the cracking of the substrate at the valley portion can be reduced as compared with the V-shaped cross section. The groove 9 has a width to sufficient eliminate the tapered surface (7d in FIG. 3A) formed at the end of the ferrule support groove 7. By eliminating the tapered surface, it is possible to bring the end face of the ferrule 4 close to the side face 9a of the groove 9 and the optical fiber extending from the ferrule 4 immediately reaches the optical fiber support groove. The connection groove 9 can be formed, for example, by dicing from the side face of the substrate 25 to the other.

Although this embodiment indicates the sequence in which the connection groove 9 is formed after the formation of the positioning groove 8, the sequence should not be restricted thereto. Since the methods of manufacturing of the principal portions of optical modules 1, 20 do not differ from each other except for the connection groove formation, the following steps are applicable to the manufacturing of any of them. In this embodiment, the subsequent steps are applied for the substrate 25 after the connection groove formation.

Figure 6A:
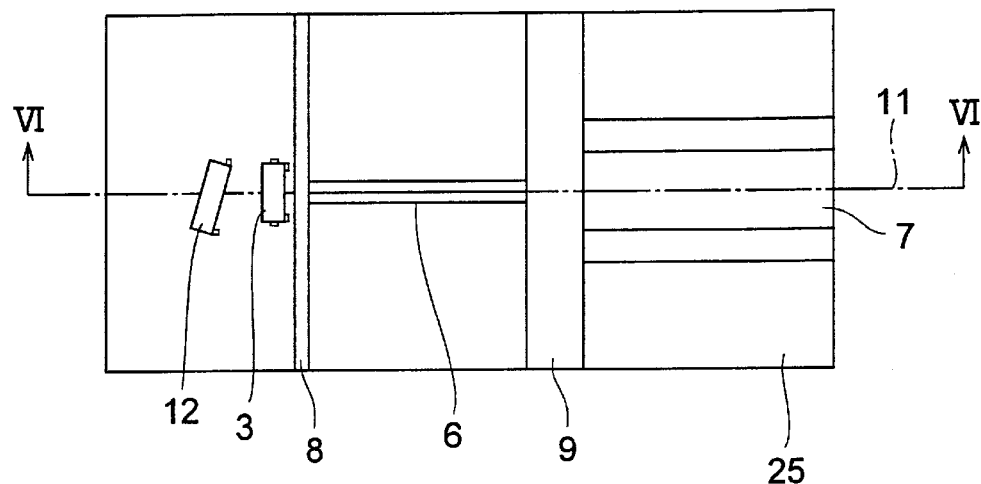
FIG. 6A is a plan view showing a manufacturing step of an optical module after a device mounting step.
Figure 6B:
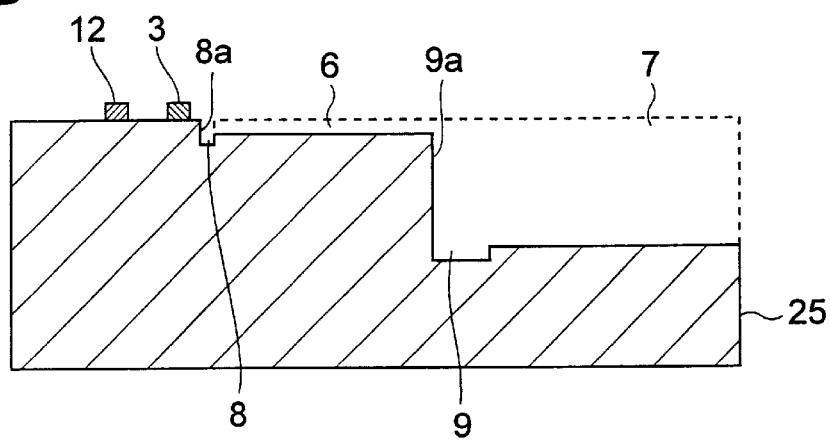
FIG. 6B is a sectional view taken along the VI—VI section in FIG. 6A.

FIG. 6A is a plan view of the substrate 25 in the device mounting step, and FIG. 6B is a sectional view taken along the VI—VI section in FIG. 6A. In the device mounting step, the light-emitting element 3 is mounted on the substrate 25 such that the element 3 faces to the end of the optical fiber support groove 6. By using the positioning mark simultaneously formed in the groove formation step for the mounting of the light-emitting element 3, the optical axis of the light emitted from the element 3 can coincide with the optical axis of the optical fiber 2. A light-receiving element such as a photodiode 12 is mounted behind the light-emitting element 3 by using the positioning mark, too. The light-receiving element 12 would be aligned at a predetermined position with desirably relative accuracy to the center axis 11 of the optical fiber support groove 6. When the optical fiber 2 is installed in its support groove 6 in a later step, the tip 2a of the optical fiber 2 faces to the light-emitting surface of the light-emitting element 3.

Figure 7A:
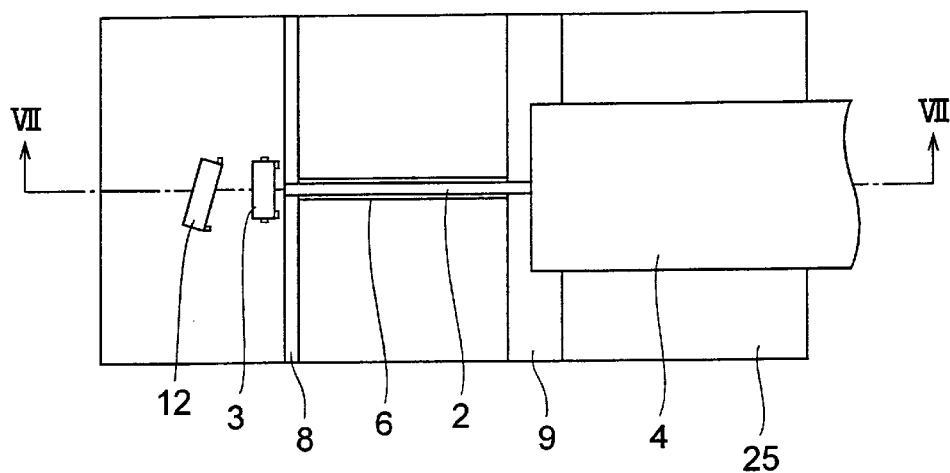
FIG. 7A is a plan view showing a manufacturing step of an optical module after a fiber installing step.
Figure 7B:
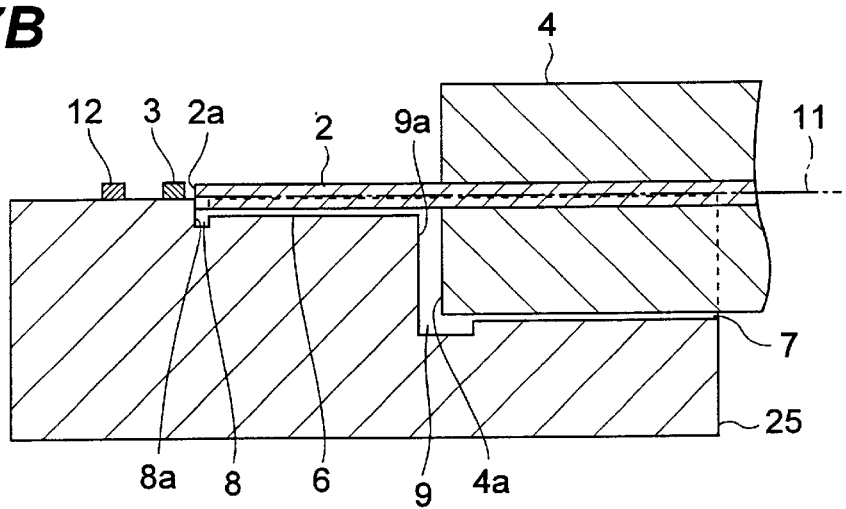
FIG. 7B is a sectional view taken along the VII—VII section in FIG. 7A.

FIG. 7A is a plan view of the principal portion 20 of the optical module in the fiber installing step, and FIG. 7B is a sectional view taken along the VII—VII section in FIG. 7A. In the fiber installing step, the optical fiber 2 is disposed in the optical fiber support groove 6 to be optically coupled to the light-emitting element 3. The tip of the optical fiber 2 is abutted to the side face 8a of the positioning groove 8. The optical fiber 2 is supported in the optical fiber support groove 6 by two side faces constituting the V-shaped groove. The ferrule 4 in the ferrule support groove 7 is supported by two side faces constituting the trapezoid groove. The end face 4a of the ferrule faces to the side face 9a of the connection groove 9. The extending portion of the optical fiber 2 from the ferrule 4 immediately reaches the optical fiber support groove by that arrangement.

The substrate including the light-emitting element 3, the optical fiber 2, and the ferrule 4 are mounted on a lead frame. By potting and curing a potting resin (not illustrated), the light-emitting element 3, the ferrule 4, and the uncovered portion of the optical fiber 2 are secured. Thereafter, a transfer molding is performed to encapsulate the principal portion 1 with epoxy resin. After the lead frame is cut and reformed, the optical module is accomplished.

It can be appreciated from the foregoing explanation that the principal portions 1, 20 of the optical module shown in FIG. 1A and FIG. 2 are obtained when the groove formation step, the positioning groove formation step, the device mounting step, and the fiber installing step are employed in this order. These manufacturing steps can be similarly applied to the optical modules that will be described below. The difference of each module 1, 20 is only that the principal portion of the optical module 20 requires the step of forming the connection groove 9.

Figure 8:
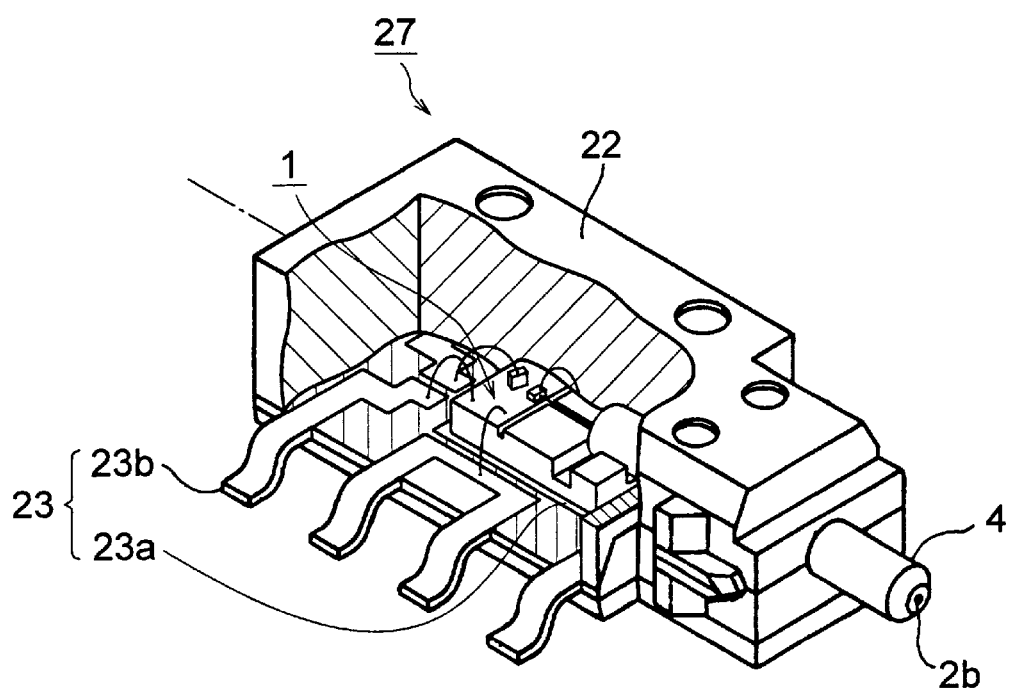
FIG. 8 is a perspective view of an accomplished optical module in accordance with the present invention.

FIG. 8 shows an accomplished optical module 27. It is a partly fragmentary view to elucidate the relation among the principal portion 1, 20, a resin molded body 22, and a lead frame containing the island 23a and lead pins 23b. The ferrule 4 projects from the end face of the resin molded body 22. The tip 2b of the optical fiber 2 appears at the end face of the ferrule 4.

The connection groove 9 is provided to eliminate the tapered surface formed at the end portion of the ferrule support groove. Since the width of ferrule support groove 7 is about 10 times larger than that of the optical fiber support groove 6, the dimensional tolerance of the ferrule support groove would increase. There still may occur positional deviation of the center axis between the ferrule and the optical fiber. The embodiments described in the following can provide a substrate, an optical module, and a method of manufacturing the optical module, which overcome the problem mentioned above. Descriptions concerning to the substrate, the optical module, and the method of manufacturing the optical module are also applicable unless noted in particular.

Figure 10:
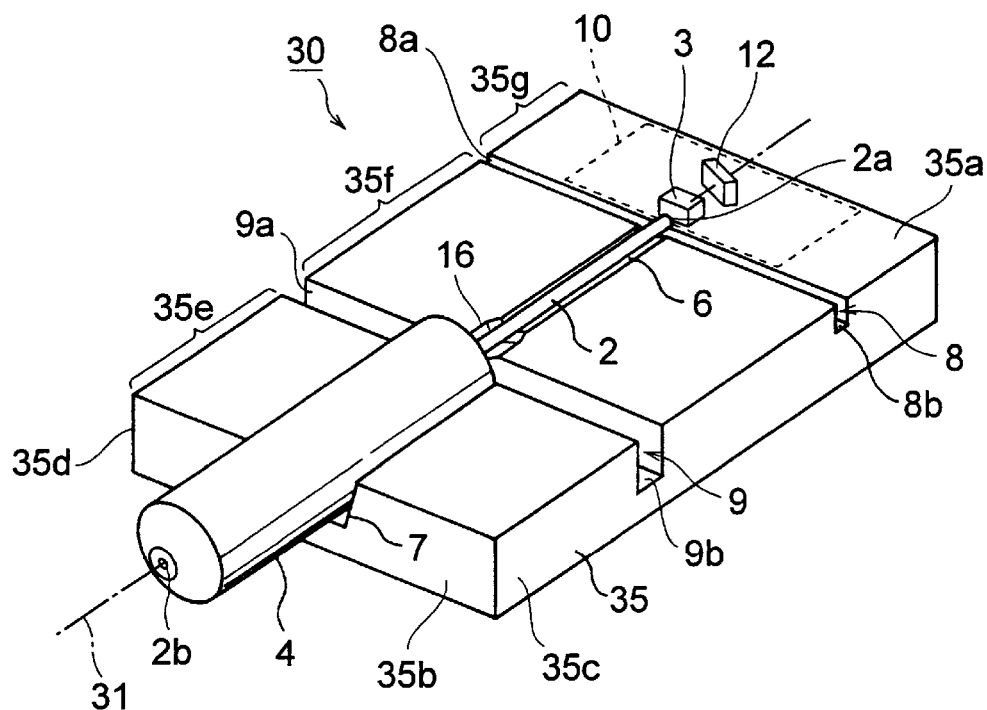
FIG. 10 is a perspective view of a principal portion of an optical module with a connection groove and an intermediate groove in accordance with the present invention.

FIG. 10 shows a principal portion 30 of an optical module in which an intermediate groove 16 is provided. The principal portion 30 in FIG. 10 is similar to the one shown in FIG. 2 except for the intermediate groove 16. The description concerning the substrate 25 in FIG. 2 can be similarly applied to the substrate 35. Referring to FIG. 10, the substrate 35 comprises a first region 35e, a second region 35f, and a third region 35g along a predetermined 31. An intermediate groove 16 is formed at the end portion of the optical fiber support groove 6 in the second region 35f. The other feature will not be described here because they are the same as those in FIG. 2.

The intermediate groove 16 is provided between the optical fiber support groove 6 and the ferrule support groove 7. These grooves 6, 7, and 16 extend along the axis 31. The depth of the intermediate groove 16 is deeper than that of the optical fiber support groove 6. The width of the intermediate groove 16 is wider than that of the groove 6 but narrower than that of the ferrule support groove 7. The intermediate groove 16 has a surface 16a continuing both of two side faces of the optical fiber groove 6. The depth of the intermediate groove 16 becomes gradually deeper from the end of the optical fiber support groove 6 toward the ferrule support groove 7. The surface 16a and each of the side faces of the optical fiber support groove 6 makes an obtuse angle at the boundaries.

Figure 11A:
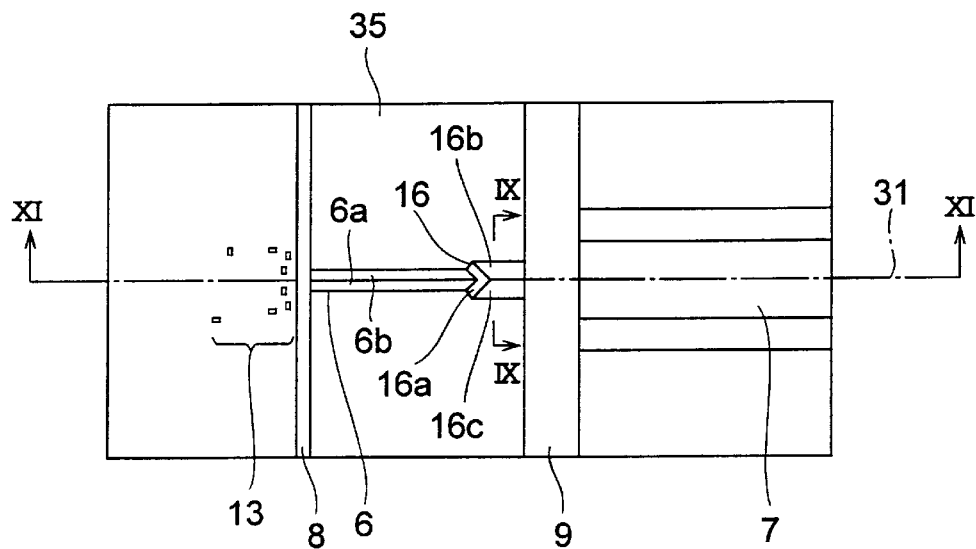
FIG. 11A is a plan view of the substrate in accordance with the present invention.
Figure 11B:
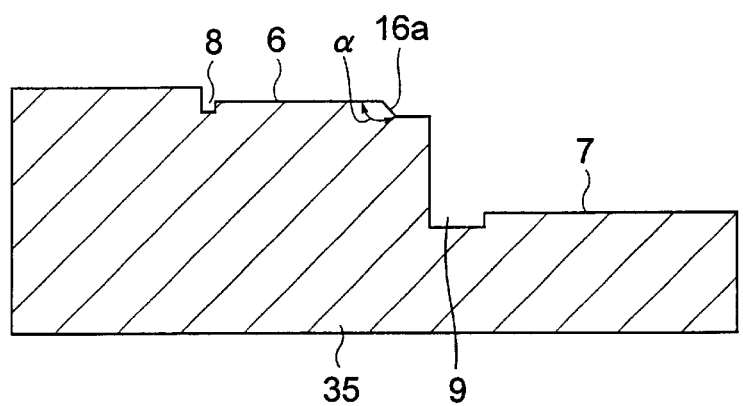
FIG. 11B is a sectional view of the substrate taken along the XI—XI section in FIG. 11A.

FIG. 11A is a plan view showing the optical fiber support groove 6, the ferrule support groove 7, and the intermediate groove 16. FIG. 11B is a sectional view taken along the XI—XI section in FIG. 11A. Three grooves 6, 7, 16 are formed on the surface of the substrate 35 as follows. Silicon with (100) surface as a main surface is employed as the substrate 35. When the groove 6, 7, 16 is formed along [110] direction by chemical etching using KOH solution, crystal surfaces with slower etching rate appear. A photosensitive material with a desired pattern is formed. The pattern corresponds to the optical fiber support groove 6, the ferrule support groove 7, and the intermediate groove 16. Etching the substrate 35 using this pattern as a mask in a predetermined period, the grooves 6, 7, 16 are formed with their desirable depths and widths. Tapered surfaces determined by the surface orientation appear at the end portion of each groove. In this example, the tapered surface has (111) or its equivalent Miller indices.

Figure 16A:
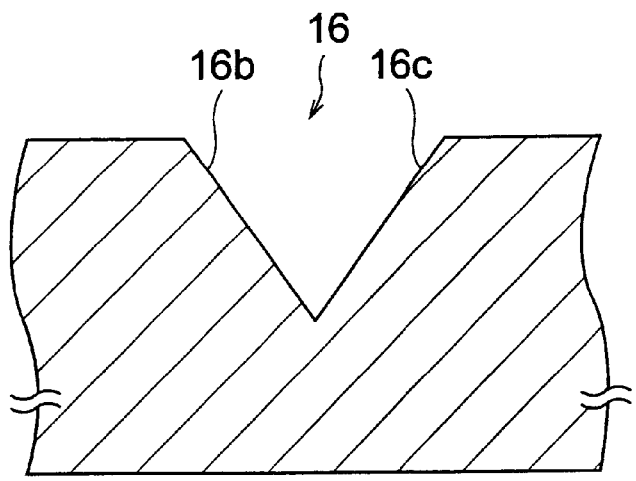
FIG. 16A is a sectional view taken along the IX—IX section in FIG. 11A.

The intermediate groove 16 continues to the connection groove 9. The portion of the optical fiber extending from the optical fiber support groove passes through the intermediate groove and the connection groove and reaches to the ferrule in the ferrule support groove. The intermediate groove does not support the optical fiber because the depth of the groove 16 is deeper than that of the optical fiber support groove 6. The intermediate groove 16 has a V-Shaped cross-sectional form as shown in FIG. 16A. FIG. 16A shows the sectional view of the groove 16 taken along the IX—IX section in FIG. 11A. Although a tapered surface is formed at the end portion of the ferrule support groove 7, it can be eliminated by forming the connection groove 9.

Figure 12A:
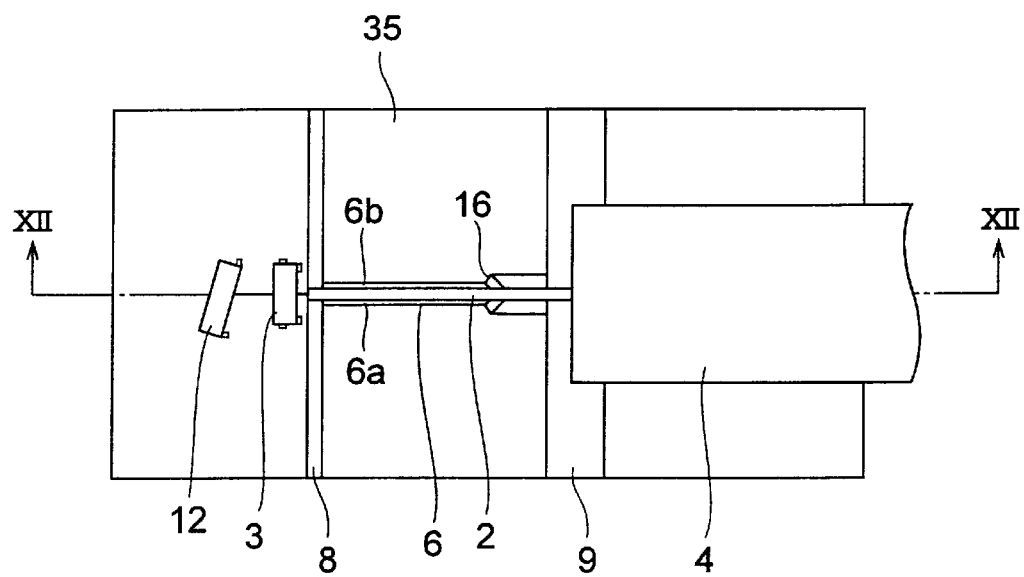
FIG. 12A is a plan view of the substrate with an optical fiber and a ferrule in accordance with the present invention.
Figure 12B:
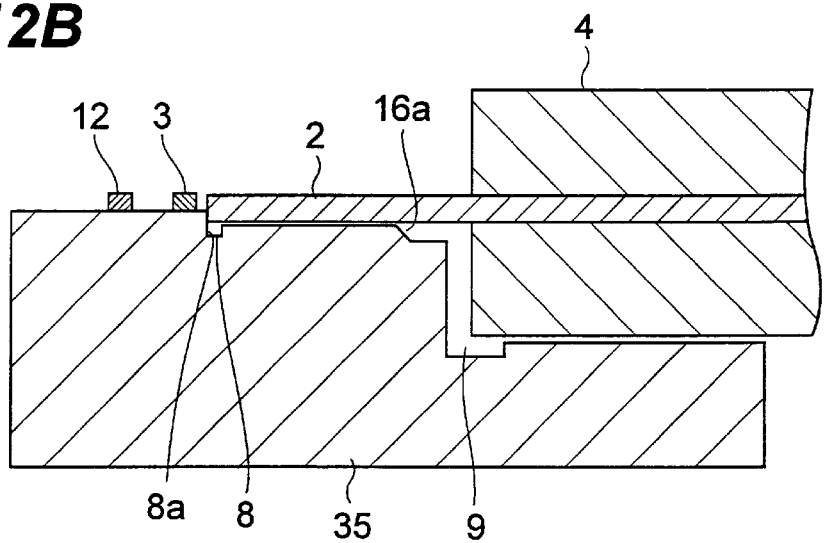
FIG. 12B is a sectional view of the substrate taken along the XII—XII section in FIG. 12A.

FIG. 12A is a plan view showing the optical fiber 2 and the ferrule 4 installed in the substrate 35. FIG. 12B is a sectional view taken along the XII—XII section in FIG. 12A. In FIG. 12B, the intermediate groove 16 has a tapered surface 16a forming an obtuse angle a with the optical fiber support groove 6. When a center axis of the optical fiber support groove deviates from the center axis of the ferrule support groove, the optical fiber is in contact to the apex with an obtuse angel. The stress applied to the optical fiber 2 is reduced. When the tip of the optical fiber 2 abuts to the side face 8a of the positioning groove 8, the optical fiber slightly flexes and is bent at the apex between the groove 6 and groove 16. Since the angle of the apex is obtuse, the optical fiber 2 may receive the stress lower than the conventional one.

The dimensional tolerance of the ferrule support groove would increase because the width of the ferrule support groove is about 10 times larger than that of the optical fiber support groove. Even when the optical fiber support groove 6 and the ferrule support groove 7 are formed in the same manufacturing step, positional deviation can not be completely eliminated. The intermediate groove can restrain the stress caused to the optical fiber due to the positional deviation.

Figure 13:
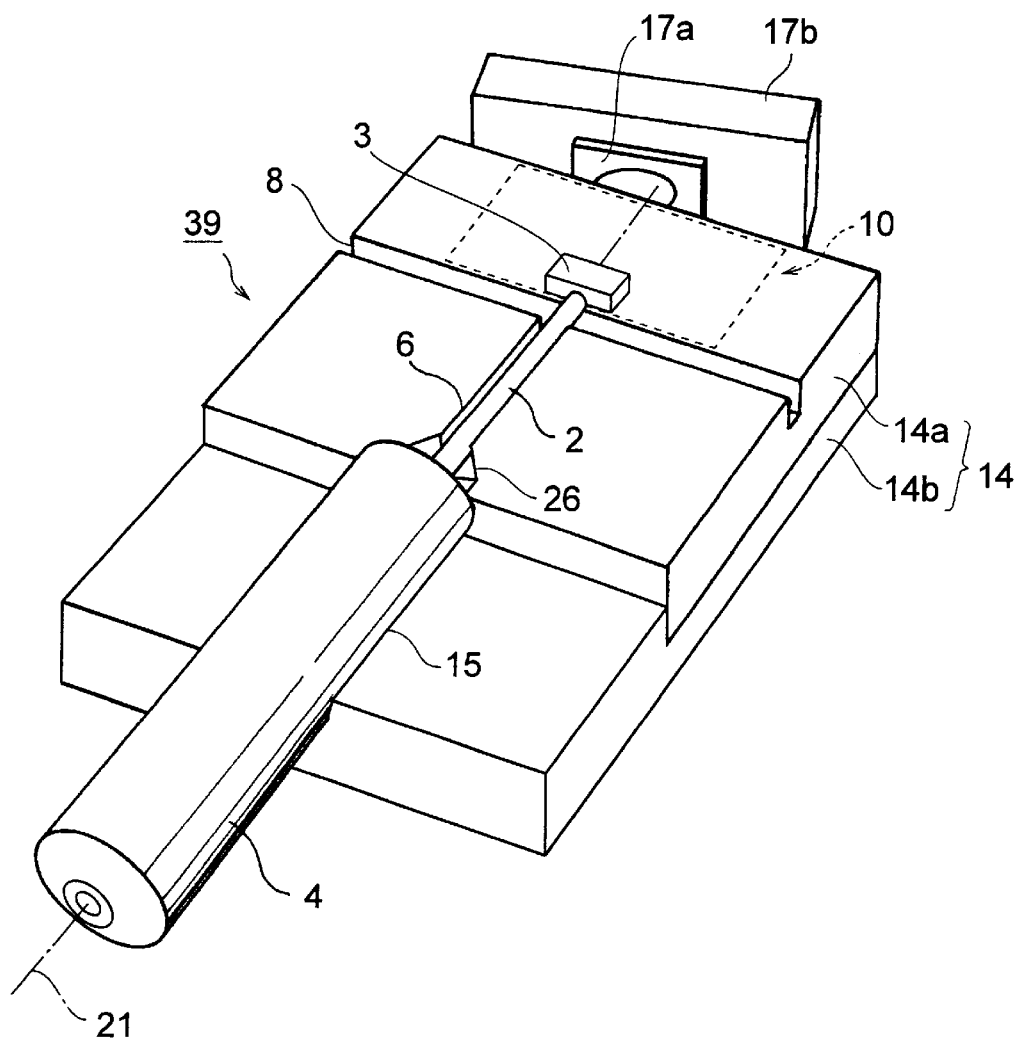
FIG. 13 is a perspective view showing a principal portion of an optical module with an intermediate groove in accordance with the present invention.

Another optical module in accordance with an embodiment will be explained with reference to FIG. 13. FIG. 13 is a perspective view showing a principal portion of an optical module. The principal portion of the optical module as shown in FIG. 13 has an intermediate groove 26. The description concerning the intermediate groove 16 can be applied to the groove 26 as shown in FIG. 13. Referring to FIG. 13, the principal portion 39 of the optical module comprises an optical fiber 2, a semiconductor optical device 3, a ferrule 4, a substrate 14, and a monitoring photodiode 17a. The substrate 14 comprises a platform 14a and a base 14b. The platform 14a comprises an optical fiber support groove 6, an intermediate groove 26, and a positioning groove 8. The optical fiber support groove 6 extends to be centered at an axis 21 and supports the optical fiber 2 by its two side faces. The positioning groove 8 extends orthogonal to the optical fiber support groove 6. The intermediate groove 26 extends along the axis 21 from the end portion of the fiber support groove 6. The groove 26 does not support the optical fiber 2. The base 14b comprises a ferrule support groove 15 along the same axis 21. The ferrule support groove 15 supports the ferrule 4 by its two side faces. The platform 14a contains a device mount portion 10. The semiconductor optical device 3 is disposed on the device mount portion 10 to be optically coupled to the tip of the optical fiber 2. The optical axis of the light emitted from the optical device 3 is adjusted to coincide with that of the optical fiber.

Figure 14A:
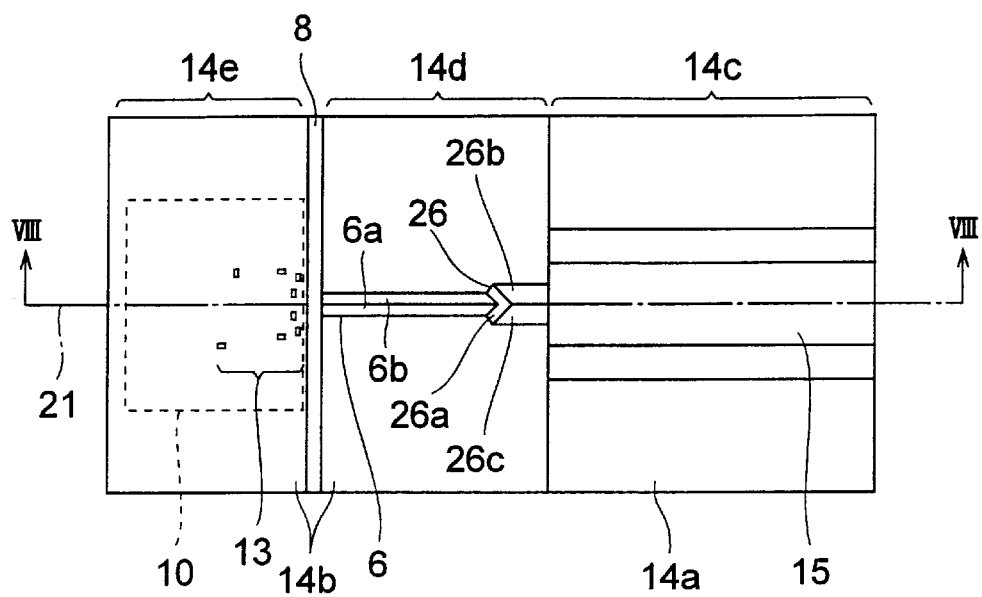
FIG. 14A is a plan view of the substrate consisting of a base and a platform with an intermediate groove.
Figure 14B:
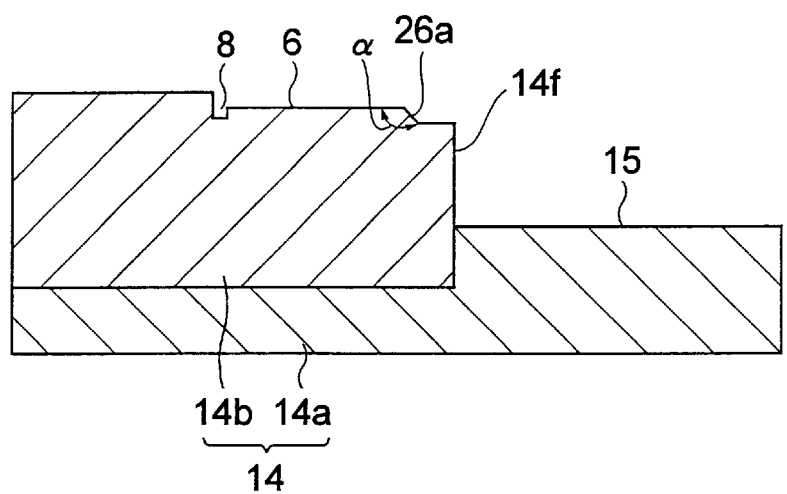
FIG. 14B is a sectional view taken along the VIII—VIII section in FIG. 14A.

FIG. 14A is a plan view of the substrate in accordance with the present embodiment. FIG. 14B is a sectional view of the substrate taken along the VIII—VIII section in FIG. 14A. According to FIGS. 14A and 14B, the substrate comprises a first region 14c, a second region 14d, and a third region 14d. The ferrule support groove 15 is formed in the first region 14c. The optical fiber support groove 6 and the intermediate groove 26 are formed in the second region 14d. The third region 14e contains the semiconductor mount portion 10. The positioning groove 8 is formed to separate the second region 14d and the third region 14e. The first region 14c and the second region 14d are separated from each other by the boundary between the platform 14a and the base 14b.

The intermediate groove 26 has a tapered surface 26a continuing both of side faces 6a and 6b of the optical fiber support groove 6. The depth of the intermediate groove 26 increases from the boundary with the optical fiber support groove 6 making an obtuse angle α (FIG. 14B). The surfaces 26a to 26c correspond to the surfaces 16a to 16c in FIGS. 11A and 11B. The intermediate groove 26 has the same function as the groove 16. Although the optical fiber 2 is bent at the apex with an obtuse angle, the stress applied to the fiber 2 is reduced as compared to the conventional. When the substrate 14 consists of the platform 14a and the base 14b as shown in FIGS. 14A and 14B, the axial deviation caused by integration remains. Since each of members 14a, 14b have individual thermal expansion coefficients, the grooves 6, 7 are deformed independently. The intermediate groove 26 is further effective in such a configuration.

Figure 15A:
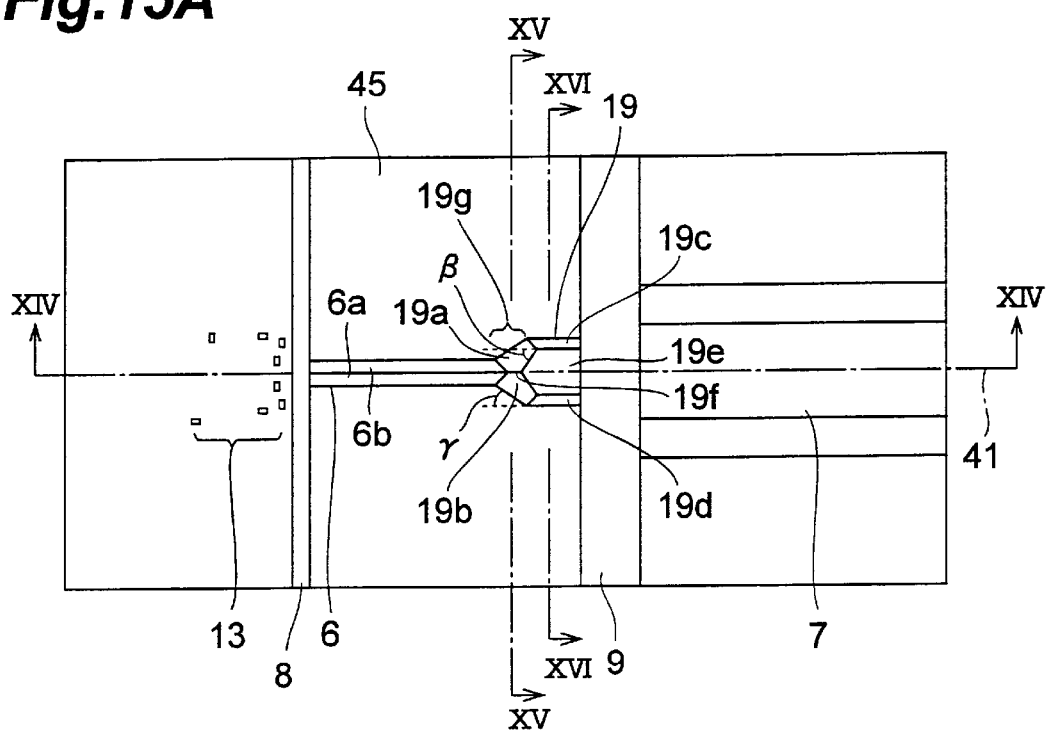
FIG. 15A is a plan view of the substrate in accordance with an embodiment of the present invention.
Figure 15B:
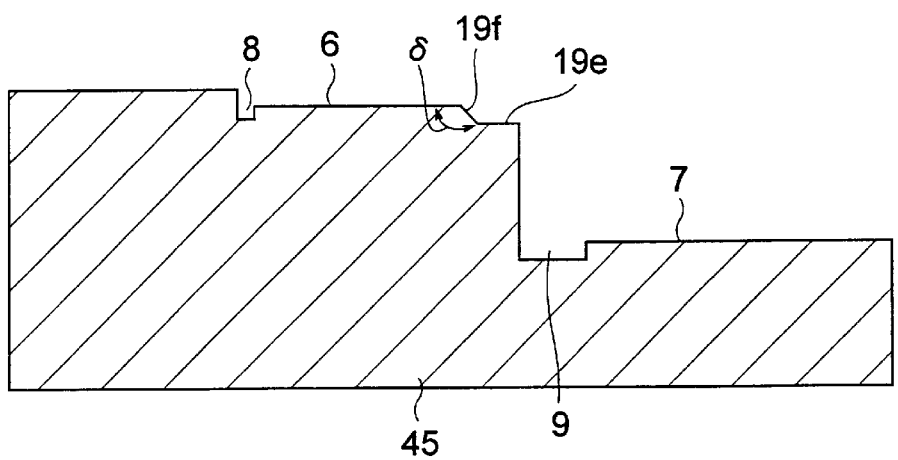
FIG. 15B is a sectional view taken along the XIV—XIV section in FIG. 15A.

FIG. 15A is a plan view of the substrate in accordance with another embodiment. FIG. 15B is a sectional view taken along the XIV—XIV section in FIG. 15A. The substrate 45 comprises the optical fiber support groove 6, the ferrule support groove 7, the connection groove 8, and the intermediate groove 19. The intermediate groove 19 extends along the axis 41 from the end of the optical fiber support groove 6 to the ferrule support groove 7. The width of the intermediate groove 19 is wider than that of the groove 6 but narrower than that of the groove 7. The groove 19 comprises tapered surfaces 19a and 19b continuing the two side faces 6a, 6b of the optical fiber support groove 6, respectively. The depth of the groove 19 increases from the boundary with the optical fiber support groove 6 making obtuse angles with their corresponding side faces 6a and 6b. The tapered surfaces 19a, 19b continue to the two side faces 19c and 19d and the bottom face 19e. The distance between two side faces 19a and 19b increases toward the ferrule support groove. In FIG. 15A, the angle β at the end of the bottom face 19e is about 45°, while the angle γ at the surface of the substrate is about 35°. These angles would vary depending on the etchant and its concentration.

When the optical fiber 2 and the ferrule 4 are installed in the groove 6 and 7, respectively, the tip of the optical fiber 2 is abutted to the side face 8a of the groove 8. The optical fiber 2 slightly flexes by abutting and is bent at the apex between the groove 6 and the groove 19. Since the angle of the apex is obtuse, the optical fiber 2 may receive the stress lower than the conventional one. In the case where the optical axis of the optical fiber support groove 6 deviates from that of the ferrule support groove 7, the optical fiber 2 installed in the groove 6 will touch the apex. Since the angle of the apex is obtuse, the optical fiber 2 may receive the stress lower than the conventional one.

Figure 16B:
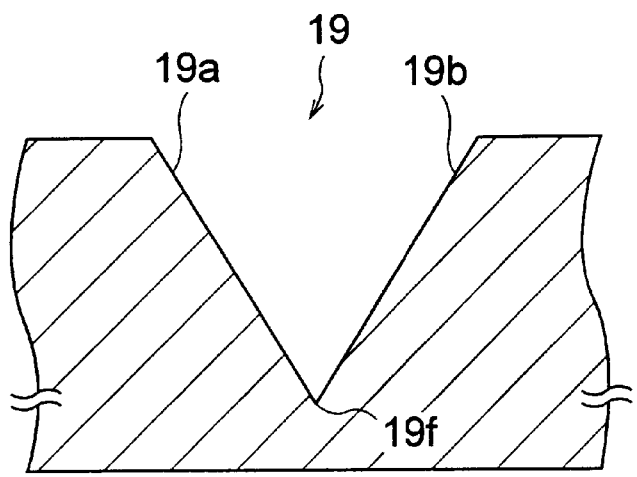
FIG. 16B is a sectional view taken along the XV—XV section in FIG. 15A.
Figure 16C:
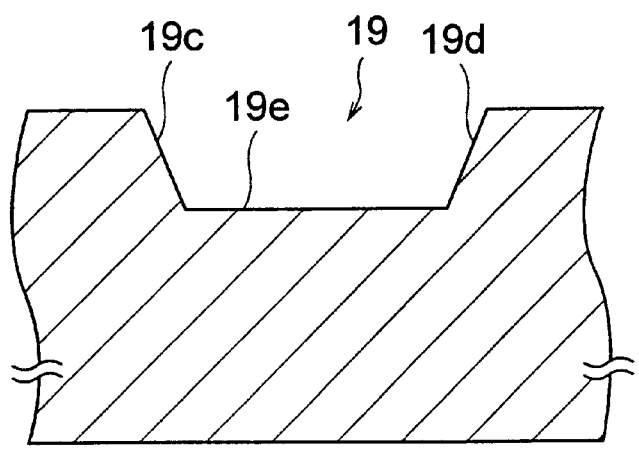
FIG. 16C is a sectional view taken along the XVI—XVI section in FIG. 15A.

FIGS. 16B and 16C show the cross-sectional forms of the grooves at their positions shown in FIG. 15A. FIG. 16B shows the form in the XV—XV section. The intermediate groove 19 has a V-shaped form at the tapered surfaces 19a and 19b. FIG. 16C shows the form of the groove 19 in the XVI—XVI section. The groove 19 has a trapezoidal cross-section containing two side faces 19c and 19d, and the bottom face 19e.

Figure 17A:
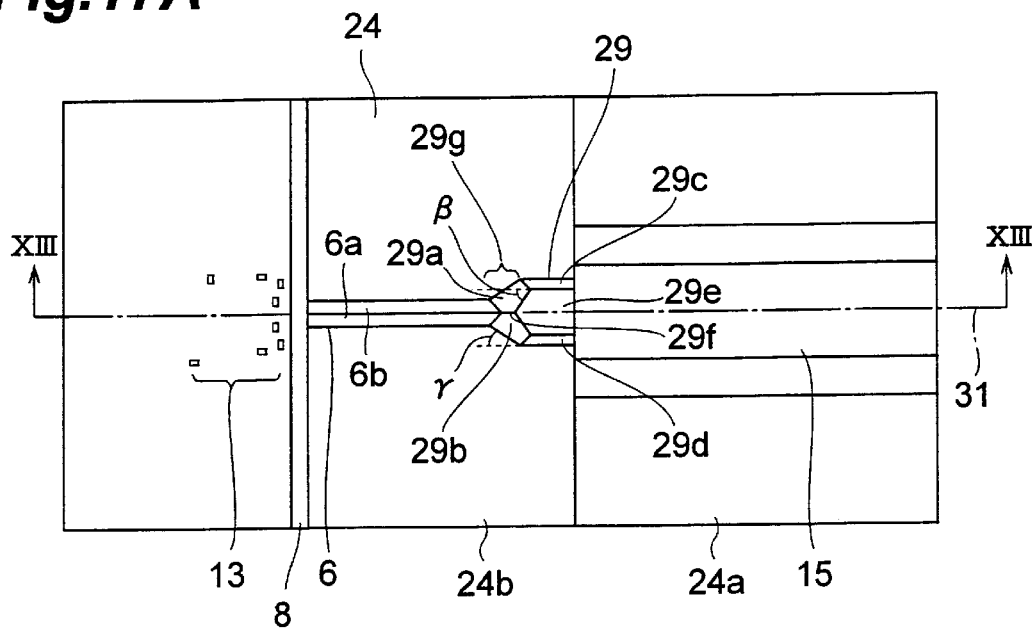
FIG. 17A is a plan view of the substrate consisting a base and a platform with an intermediate groove.
Figure 17B:
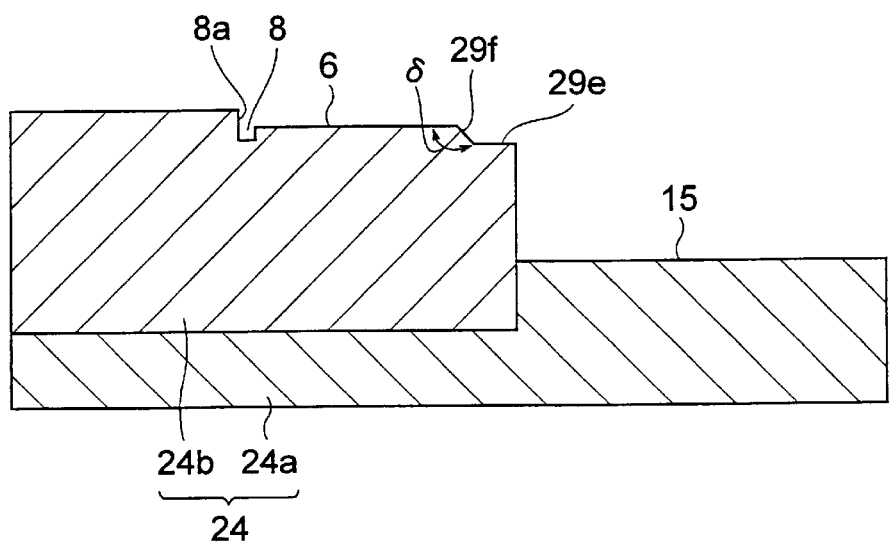
FIG. 17B is a sectional view of the substrate taken along the XIII—XIII section in FIG. 17A.

It is also applicable to the substrate having the platform 24a and the base 24b already-explained embodiment. FIG. 17A is a plan view of the substrate in accordance with another embodiment. FIG. 17B is a sectional view taken along the XIII—XIII section in FIG. 17A. According to FIG. 17A, the substrate 24 has a platform 24a and a base 24b. The intermediate groove 29 is provided in the end of the optical fiber support groove. Since the surfaces 19a to 19e in FIG. 15A correspond to the surfaces 29a to 29e of the groove 29, the description can be applied to the groove 29. When the optical fiber 2 and the ferrule 4 are installed in the groove 6 and 7, respectively, the tip of the optical fiber 2 is abutted to the side face 8a of the groove 8. The optical fiber 2 slightly flexes by abutting and is bent at the apex between the groove 6 and groove 29. Since the angle of the apex is obtuse, the optical fiber 2 may receive the stress lower than the conventional one. In this embodiment, the substrate 24 consists of the platform 24a and the base 24b, the axial deviation caused by integration remains. The intermediate groove 29 is further effective in such a configuration.

Figure 18A:
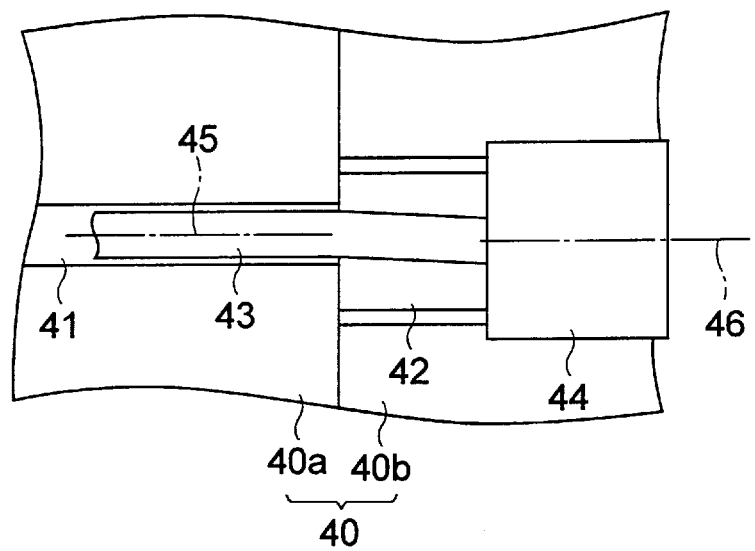
FIGS. 18A and 18B are views in a case where an optical fiber and a ferrule are mounted on a substrate.
Figure 18B:
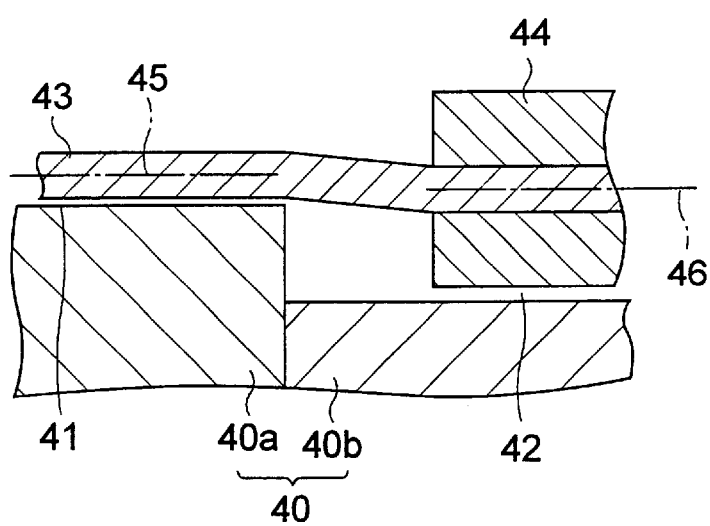

Referring to the FIGS. 18A and 18B, the substrate in accordance with present invention will be compared to the prior art. FIG. 18A is a plan view where an optical fiber 43 and a ferrule 44 are installed in the substrate 40. FIG. 18B is a sectional view of the substrate 40 in a plane including the optical fiber. The substrate consists of a platform 40a and a base 40b. The optical fiber 32 is supported by two side faces of an optical fiber support groove 41. A ferrule 44 is supported by two side faces of a ferrule support groove 42. The optical fiber 32 is bent at the end edge of the platform 40a. The end face of the platform 40a and the side faces of the groove 41 makes the apex with substantially a right angle. The optical fiber 32 partly flexes when the center axis of the optical fiber 45 deviates from that of the ferrule 46. FIG. 18A shows a case where there is a horizontal deviation, while FIG. 18B shows a vertical deviation. The deviation between center axes 45 and 46 may occur on manufacturing due to various reasons such as misalignment of the platform. The optical fiber flexes and is stressed at the apex.

In the substrate 14, 24, 35, and 45 as explained with references to the drawings, the tapered surfaces of the intermediate grooves 16, 19, 26, 29 and the side faces of the optical fiber support groove make obtuse angles therebetween. When the center axis of the optical fiber 2 deviates from that of the ferrule support groove 7, 15, the optical fiber 2 is bent at the apex with obtuse angle. Therefore, stress applied to the optical fiber can be reduces compared to the conventional one.

The optical fiber 2 slightly flexes when it is installed in the optical fiber support groove 6 and abutted to the side face of the positioning groove 8a. The optical fiber is bent at the apex with an obtuse angle. Therefore, stress applied to the bared fibers at the apex can be effectively reduced. This achieves the further improved durability of the optical fiber. The intermediate grooves 16, 19, 26, and 29 function as thermal stress absorbing portions after fixing with a potting resin.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical module comprising:
   a substrate having first, second, and third regions successively provided along a predetermined axis, said substrate comprising:

a) a ferrule support groove formed in said first region and extending along said predetermined axis,
b) an optical fiber support groove formed in said second region and extending along said predetermined axis, and
c) a device mount portion formed in said third region; an optical fiber provided in said optical fiber support groove;
a ferrule provided in said ferrule support groove; and
a semiconductor optical device provided in said device mount portion to be optically coupled to said optical fiber,
wherein said substrate consists of a single member, and wherein said substrate further comprises a connection groove intersecting said predetermined axis, said connection groove separating said first region from said second region and having a portion deeper than said ferrule support groove.

2. An optical module according to claim 1, wherein said substrate further comprises a positioning groove intersecting said predetermined axis, said positioning groove separating said second region from said third region.

3. An optical module according to claim 1, wherein said ferrule support groove has a trapezoidal cross-sectional form.

4. An optical module according to claim 1, wherein said device mount portion includes a positioning mark for indicating a mount position for said semiconductor optical device.

5. An optical module according to claim 1, wherein said substrate further comprises an intermediate groove formed between said optical fiber support groove and said ferrule support groove in said second region, said optical fiber support groove having two faces for supporting said optical fiber, said intermediate groove having a width wider than that of said optical fiber support groove and having a tapered surface making an obtuse angle with each of two faces of said optical fiber support groove.

6. An optical module according to claim 1, wherein said substrate further comprises an intermediate groove formed between said optical fiber support groove and said ferrule support groove in said second region, said optical fiber support groove having two faces for supporting said optical fiber, said intermediate groove having a width wider than that of said optical fiber support groove and having two tapered surfaces, one of said surfaces of said intermediate groove making an obtuse angle with one of said faces of said optical fiber support groove, the other of said surfaces of said intermediate groove making an obtuse angle with the other of said faces of said optical fiber support groove, a distance between said surfaces of said intermediate groove with respect to a direction orthogonal to said predetermined axis continuously increasing from said optical fiber support groove toward said ferrule support groove.

7. An optical module according to claim 1, wherein said substrate is made of silicon.

8. A substrate for an optical module, said substrate having first, second, and third regions successively provided along a predetermined axis thereon, said substrate comprising:
a ferrule support groove formed in said first region for supporting a ferrule and extending along said predetermined axis;
an optical fiber support groove formed in said second region for supporting an optical fiber and extending along said predetermined axis; and
a device mount portion formed in said third region for mounting a semiconductor optical device, said semiconductor optical device being provided in said device mount portion to be optically coupled to said optical fiber;
wherein said substrate consists of a single member, said substrate further comprising a connection groove intersecting said predetermined axis, said connection groove separating said first region from said second region and having a portion deeper than said ferrule support groove.

9. A substrate for an optical module according to claim 8, wherein said ferrule support groove has a trapezoidal cross-sectional form.

10. A substrate for an optical module according to claim 8, further comprising a positioning groove intersecting said predetermined axis, said positioning groove separating said second region from said third region.

11. A substrate for an optical module according to claim 8, wherein said substrate is made of silicon.

12. A substrate for an optical module according to claim 8, wherein said device mount portion includes a positioning mark for indicating a mount position for said semiconductor optical device.

13. A substrate for an optical module according to claim 8, further comprising an intermediate groove formed between said optical fiber support groove and said ferrule support groove in said second region, said optical fiber support groove having two faces for supporting said optical fiber, said intermediate groove having a width wider than that of said optical fiber support groove and having a tapered surface making an obtuse angle with each of two faces of said optical fiber support groove.

14. A substrate for an optical module according to claim 8, further comprising an intermediate groove formed between said optical fiber support groove and said ferrule support groove in said second region, said optical fiber support groove having two faces for supporting said optical fiber, said intermediate groove having a width wider than that of said optical fiber support groove and having two tapered surfaces, one of said surfaces of said intermediate groove making an obtuse angle with one of said faces of said optical fiber support groove, the other of said surfaces of said intermediate groove making an obtuse angle with the other of said faces of said optical fiber support groove, a distance between said surfaces of said intermediate groove with respect to a direction orthogonal to said predetermined axis continuously increasing from said optical fiber support groove toward said ferrule support groove.

15. An optical module comprising:
a substrate having first, second, and third regions successively provided along a predetermined axis, said substrate comprising:
a) a ferrule support groove formed in said first region and extending along said predetermined axis,
b) an optical fiber support groove formed in said second region and extending along said predetermined axis, and
c) a device mount portion formed in said third region; an optical fiber provided in said optical fiber support groove,
a ferrule provided in said ferrule support groove; and
a semiconductor optical device provided in said device mount portion to be optically coupled to said optical fiber;
wherein said substrate further comprises an intermediate groove formed between said optical fiber support groove and said ferrule support groove in said second region, said optical fiber support groove having two faces for supporting said optical fiber, said intermediate groove having a width wider than that of said optical fiber support groove and having a tapered surface making an obtuse angle with each of two faces of said optical fiber support groove; and wherein said substrate comprises a platform portion and a base portion, said base portion being mounted on said platform portion, said platform portion including said ferrule support groove, and said base portion including said optical fiber support groove and said device mount portion.

16. The optical module according to claim 15, wherein said device mount portion includes a positioning mark for indicating a mount position for said semiconductor optical device.

17. The optical module according to claim 15, wherein said ferrule support groove has a trapezoidal cross sectional form.

18. The optical module according to claim 15, wherein said substrate further comprises a positioning groove intersecting said predetermined axis, said positioning groove separating said second region from said third region.

19. An optical module comprising:
 a substrate having first, second, and third regions successively provided along a predetermined axis, said substrate comprising:
  a) a ferrule support groove formed in said first region and extending along said predetermined axis,
  b) an optical fiber support groove formed in said second region and extending along said predetermined axis; and
  c) a device mount portion formed in said third region;
 an optical fiber provided in said optical fiber support groove,
 a ferrule provided in said ferrule support groove; and
 a semiconductor optical device provided in said device mount portion to be optically coupled to said optical fiber;

wherein said substrate further comprises an intermediate groove formed between said optical fiber support groove and said ferrule support groove in said second region, said optical fiber support groove having two faces for supporting said optical fiber, said intermediate groove having a width wider than that of said optical fiber support groove and having two tapered surfaces, one of said surfaces of the intermediate groove making an obtuse angle with one of said faces of said optical fiber support groove, the other of said surfaces of the intermediate groove making an obtuse angle with the other of said faces of said optical fiber support groove, a distance between said surfaces of said intermediate groove with respect to a direction orthogonal to said predetermined axis continuously increasing form said optical fiber support groove toward said ferrule support groove; and wherein said substrate comprises a platform portion and a base portion, said base portion being mounted on said platform portion, said platform portion including said ferrule support groove, and said base portion including said optical fiber support groove and said device mount portion.

20. The optical module according to claim 19, wherein said ferrule support groove has a trapezoidal cross sectional form.

21. The optical module according to claim 19, wherein said device mount portion includes a positioning mark for indicating a mount position for said semiconductor optical device.

22. The optical module according to claim 19, wherein said substrate further comprises a positioning groove intersecting said predetermined axis, said positioning groove separating said second region from said third region.

* * * * *